US007005933B1

(12) United States Patent
Shutt (10) Patent No.: US 7,005,933 B1
(45) Date of Patent: Feb. 28, 2006

(54) DUAL MODE RELAXATION OSCILLATOR GENERATING A CLOCK SIGNAL OPERATING AT A FREQUENCY SUBSTANTIALLY SAME IN BOTH FIRST AND SECOND POWER MODES

(75) Inventor: James Shutt, Bothell, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 559 days.

(21) Appl. No.: 09/912,768

(22) Filed: Jul. 24, 2001

Related U.S. Application Data (60) Provisional application No. 60/243,708, filed on Oct. 26, 2000.

(51) Int. Cl.
*H03B 3/02* (2006.01)
*H03K 3/26* (2006.01)
*G06F 1/32* (2006.01)

(52) U.S. Cl. ........................ 331/143; 331/111; 713/320
(58) Field of Classification Search ................ 713/320, 713/322, 323, 111, 129, 143
See application file for complete search history.

(56) References Cited

U.S. PATENT DOCUMENTS

| | | | | |
|---|---|---|---|---|
| 3,740,588 | A | * 6/1973 | Stratton et al. ............. | 327/175 |
| 3,831,113 | A | * 8/1974 | Ahmed ........................ | 331/111 |
| 4,138,671 | A | 2/1979 | Comer et al. ............... | 340/347 |
| 4,250,464 | A | * 2/1981 | Schade, Jr. .................. | 331/65 |
| 4,977,381 | A | * 12/1990 | Main .......................... | 331/111 |
| 5,202,687 | A | 4/1993 | Distinti ....................... | 341/158 |
| 5,235,617 | A | * 8/1993 | Mallard, Jr. ................. | 375/288 |
| 5,426,384 | A | * 6/1995 | May ............................. | 327/52 |
| 5,633,766 | A | 5/1997 | Hase et al. .................... | 360/51 |
| 5,939,949 | A | 8/1999 | Olgaard et al. ............... | 331/17 |
| 6,052,035 | A | * 4/2000 | Nolan et al. ................... | 331/74 |
| 6,144,327 | A | 11/2000 | Distinti et al. ............... | 341/126 |
| 6,157,270 | A | 12/2000 | Tso ............................. | 331/176 |
| 6,191,660 | B1 | 2/2001 | Mar et al. .................... | 331/111 |
| 6,362,697 | B1 | * 3/2002 | Pulvirenti .................... | 331/111 |

FOREIGN PATENT DOCUMENTS

EP 368398 A1 * 5/1990

OTHER PUBLICATIONS

Song et al, A 50% Power Reduction Scheme for CMOS Relaxation Oscillator, 1999 IEEE, pp. 154-157.*
CYPR-CD00196; "A Novel Band-Gap Circuit for Providing an Accurate Reference Voltage Compensated for Process State, Process Variations and Temperature"; Sep. 26, 2001; U.S. Appl. No. 09/964,991; Kutz et al.
CYPR-CD00201; "A Crystal-Less Oscillator Circuit With Trimmable Analog Current Control for Increased Stabilty"; Sep. 19, 2001; U.S. Appl. No. 09/957,084; Mar et al.

* cited by examiner

*Primary Examiner*—Thomas Lee
*Assistant Examiner*—Suresh K Suryawanshi (57) ABSTRACT

A microcontroller having a dual mode relax oscillator that is trimmable. In one embodiment, the present invention provides a relaxation oscillator circuit comprising two current sources for establishing a reference voltage for use in causing the relaxation oscillator circuit to operate in two power modes, and a control coupled to both current sources for switching between power modes. In one embodiment, one power mode is a low power mode for standard operation of the microcontroller and one power mode is a very low power mode for use in a sleep mode. In one embodiment, the relaxation oscillator circuit further comprises digitally trimmable components operable to control a current charging a capacitor of the relaxation oscillator circuit to account for process variation in the capacitor, wherein the current is for controlling a frequency of the microcontroller.

26 Claims, 5 Drawing Sheets

DUAL MODE RELAXATION OSCILLATOR GENERATING A CLOCK SIGNAL OPERATING AT A FREQUENCY SUBSTANTIALLY SAME IN BOTH FIRST AND SECOND POWER MODES

RELATED U.S. APPLICATION

This application claims priority to the copending provisional patent application, Ser. No. 60/243,708, entitled "Advanced Programmable Microcontroller Device," with filing date Oct. 26, 2000, and assigned to the assignee of the present application.

FIELD OF INVENTION

The present invention relates to the field of semiconductor devices. More particularly, the present invention relates to a microcontroller having a dual mode relax oscillator that is trimmable.

BACKGROUND OF THE INVENTION

Oscillator circuits are used with digital electronic circuits (e.g., microcontrollers and microprocessors) to generate a clock signal for synchronizing, pacing and coordinating the operations of the digital electronic circuit. One common form of an oscillator circuit is a relaxation oscillator circuit. A relaxation oscillator circuit uses current into a capacitor to create a capacitor voltage. The capacitor voltage is a ramp voltage. A comparator of the relaxation oscillator circuit compares a known reference voltage against the capacitor voltage. When the capacitor voltage reaches the reference voltage, the comparator switches states, creating a clock signal.

Microcontrollers are placed in a vast array of electronic devices, such as computer systems, cellular telephones and palmtop computer systems. A growing concern of users of electronic devices, particularly portable devices such as cellular telephones and palmtop computer systems, is the ability of the devices to conserve power. To conserve power, microcontrollers are often placed in a sleep mode. However, it is necessary to maintain a clock signal in a digital electronic circuit to time a wake-up event for the microcontrollers to exit the sleep mode.

Currently, when microcontrollers enter into a sleep mode, the microcontroller must either switch to a different oscillator circuit that is optimized for low power or continuously run the standard oscillator circuit. Requiring the circuit to switch to a different oscillator circuit optimized for low power requires an extra oscillator circuit, adding to the cost of the digital electronic circuit and consuming space on the microcontroller. Alternatively, running the standard oscillator circuit while in sleep mode continues to drain power, and is thus less effective in conserving power.

As described above, relaxation oscillator circuits supply current into a capacitor to create a capacitor voltage. It is essential to the effective operation of a relaxation oscillator circuit to have capacitors of the proper specifications for creating the capacitor voltage. If the capacitors are not to the proper specifications, the clock signal generated by the relaxation oscillator circuit may not function properly.

Capacitors often vary due to the fabrication process. In current relaxation oscillator circuits, it is not possible to adjust the current charging the capacitors to account for process variation. In order to ensure that capacitors are to the proper specifications, all capacitors must be tested and those that are not to specification are discarded, resulting in wasted parts. Alternatively, a relaxation oscillator circuit may be adapted to have external capacitors. However, this is not an option for a microcontroller, as there is no way to provide an external capacitor for the oscillator circuit.

SUMMARY OF THE INVENTION

Accordingly, a need exists for a relaxation oscillator that has two power modes for generating a clock signal for a microcontroller allowing a microcontroller to operate in both a standard power mode and a sleep power mode without requiring extra oscillator circuits. A need also exists for a method for generating a clock signal in a dual mode relaxation oscillator circuit. A need also exists for a relaxation oscillator circuit that accounts for capacitance process variation without requiring external capacitors.

A microcontroller having a dual mode relax oscillator that is trimmable is disclosed. In one embodiment, the present invention provides a relaxation oscillator circuit comprising a first current source, a second current source, and a control coupled to the first current source and the second current source. The first current source is for establishing a first reference voltage for use in causing the relaxation oscillator circuit to operate in a first power mode. Likewise, the second current source is for establishing a second reference voltage for use in causing the relaxation oscillator circuit to operate in a second power mode. The control is for switching between the first power mode and the second power mode.

In one embodiment, the first current source supplies a larger current than the second current source such that the first reference voltage is more accurate than the second reference voltage. In one embodiment, the first power mode is a low power mode (e.g., a standard power mode) and the second power mode is very low power mode (e.g., a sleep mode).

In one implementation, the first current source generates a current of 2 micro amps. In one implementation, the second current source generates a current of 100 nano amps.

In one implementation, the first reference voltage is established across a resister. In one implementation, the second reference voltage is established across a diode-connected field effect transistor (FET).

In one embodiment, the relaxation oscillator circuit further comprises trimmable components. The trimmable components are current sources operating in conjunction that are operable to control a current charging a capacitor of the relaxation oscillator circuit to account for process variation in said capacitor, wherein the current charging the capacitor is for controlling a frequency of a microcontroller. In one embodiment, the relaxation oscillator circuit comprises four trimmable components that can be digitally controlled.

In one embodiment, the present invention provides a microcontroller on a chip comprising a bus, a processor coupled to the bus, a memory unit coupled to the bus, a plurality of input/output pins coupled to the bus; and a timer circuit coupled to the bus for performing a timing function. In the present embodiment, the timer circuit comprises a relaxation oscillator circuit having a first power mode and a second power mode, the first power mode and the second power mode being switchable under a control.

In one embodiment, the present invention provides a method for generating a clock signal in a relaxation oscillator circuit having a first current source for a first power mode and a second current source for a second power mode. In the present embodiment, a switched current source corresponding to a present power mode is selected by switching between the first current source for the first power mode and the second current source for the second power mode. A reference voltage is then generated based on the switched current source. In response to the reference voltage, the relaxation oscillator circuit to generates the clock signal.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
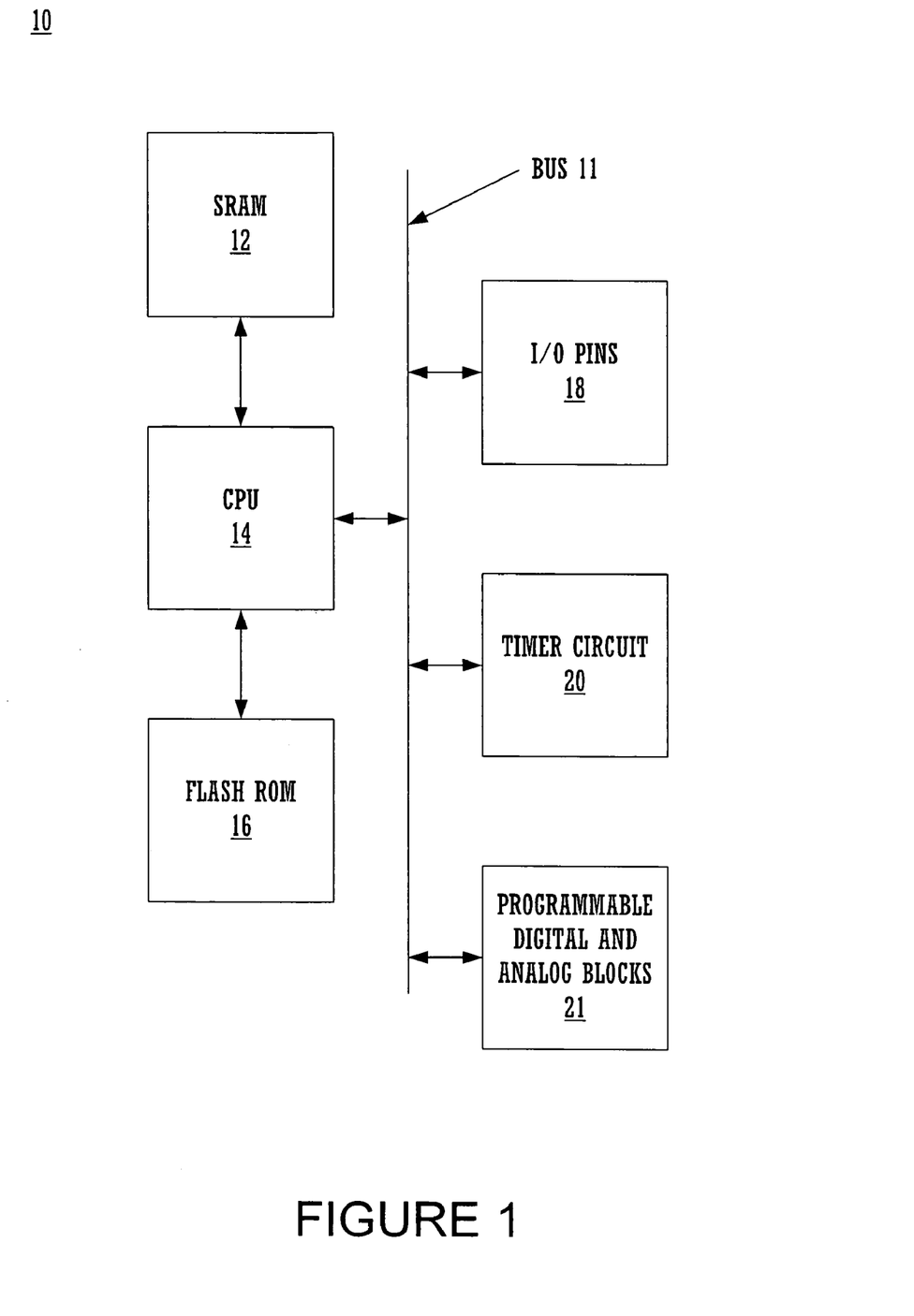
FIG. 1 is a block diagram showing an exemplary digital electronic circuit (or microcontroller) upon which embodiments of the present invention may be implemented.

FIG. 1 is a block diagram showing an exemplary integrated circuit (or microcontroller) 10 upon which embodiments of the present invention may be implemented. Circuit 10 may be implemented on a single die and packaged as a "chip" or IC device. In this embodiment, integrated circuit 10 includes a bus 11, and coupled to bus 11 are synchronous random access memory (SRAM) 12 for storing volatile or temporary data during firmware execution, central processing unit (CPU) 14 for processing information and instructions, flash read-only memory (ROM) 16 for holding instructions (e.g., firmware), input/output (I/O) pins providing an interface with external devices and the like, and timer circuit 20. Timer circuit 20 is further described below. A test interface (not shown) may be coupled to integrated circuit 10 to perform debugging operations during startup and initialization of the integrated circuit. Circuit 10 may also include several programmable analog and digital blocks 21 for implementing functions that are stored in flash ROM 16.

In the present embodiment, flash ROM 16 stores parameters describing microcontroller 10, allowing microcontroller 10 to be programmed during production, during system testing, or in the field. It is contemplated that microcontroller 10 may also be self-programmed remotely. Flash ROM 16 also contains programming for programmable analog and digital blocks 21 while SRAM 12 contains programming for CPU 14.

Timer circuit 20 performs a timing function by generating a clock signal for synchronizing, pacing and coordinating the operations of a microcontroller. In one embodiment, timer circuit 20 is a dual mode relaxation oscillator circuit. A dual mode relaxation oscillator provides a low power mode and a very low power mode for producing a clock signal, wherein the modes are switchable under a control.

Figure 2:
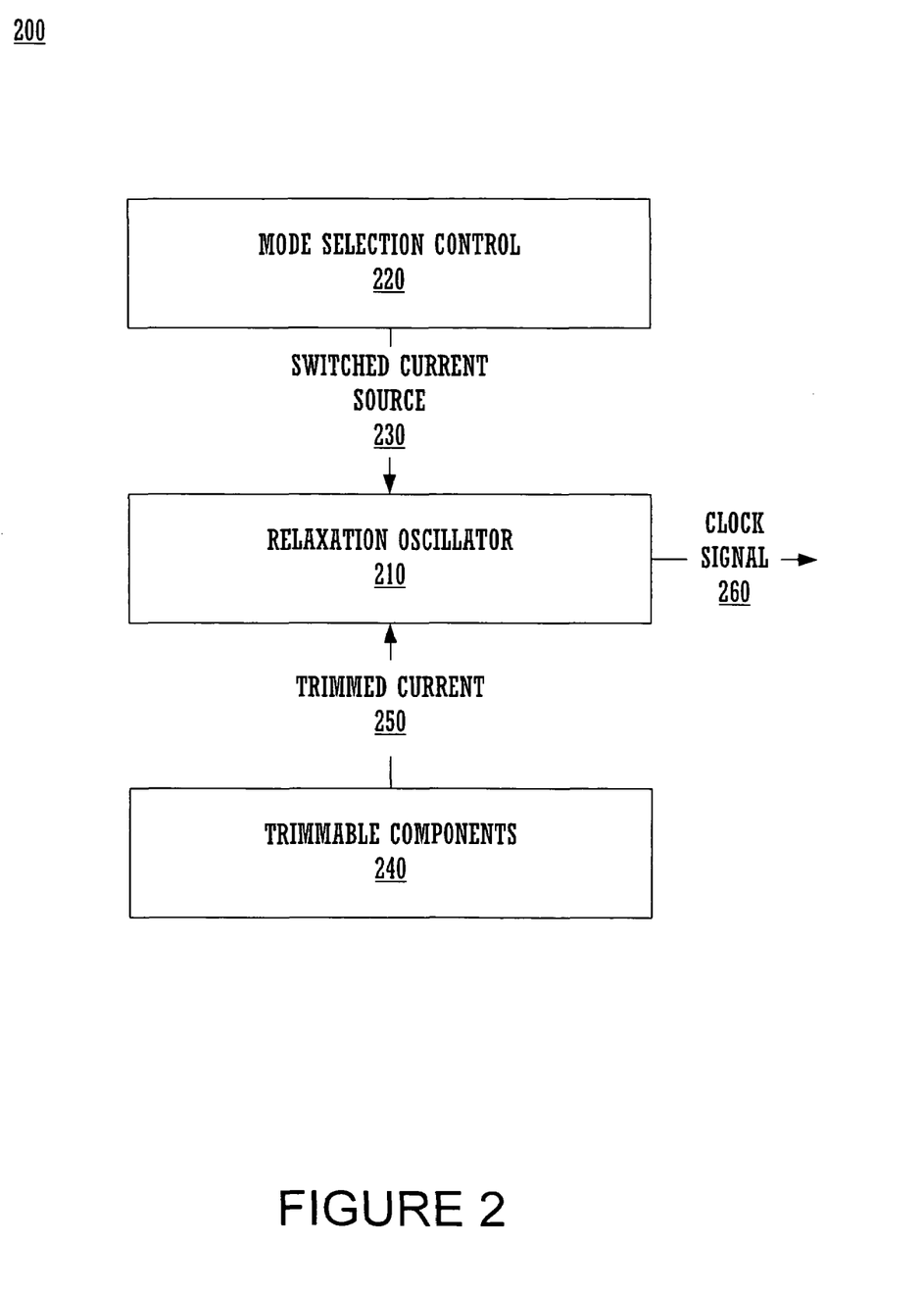
FIG. 2 is a block diagram of a dual mode relaxation oscillator circuit with trimmable components in accordance with one embodiment of the present invention.

FIG. 2 is a block diagram 200 of a dual mode relaxation oscillator circuit 210 with trimmable components 240 in accordance with one embodiment of the present invention. Trimmable components 240 may be digitally controlled.

In a preferred embodiment, dual mode relaxation oscillator circuit 210 comprises a mode selection control 220. Mode selection control 220 is operable to designate a switched current source 230 of relaxation oscillator circuit 210. In one embodiment, relaxation oscillator circuit 210 comprises two current sources. In one embodiment, a first current source is operable to produce current for operating a microcontroller in a standard low power mode and a second current source is operable to produce current for operating a microcontroller in a very low power consumption mode (e.g., a sleep mode).

In one embodiment, mode selection control 220 is a user-operated control for designating a desired power mode. In another embodiment, mode selection control 220 is a logically controlled device. It should be appreciated that mode selection control 220 can receive input on which current source is the switched current source from any number of sources, and is not meant to be limited by the above embodiments.

In a preferred embodiment, dual mode relaxation oscillator circuit 210 comprises trimmable components 240. Trimmable components 240 are current sources operating in conjunction to produce a summed current. Trimmable components 240 can be adjusted digitally to control the clock signal produced by relaxation oscillator circuit 210. In one embodiment of the present invention, trimmable components 240 are used to control the current into a capacitor (e.g., capacitor 330 or capacitor 336 of FIG. 3) for generating a capacitor voltage (e.g., capacitor voltage 338 or 340 of FIG. 3). The trimmable components are operable to account for process variation in a capacitor. By providing for a trimmable relaxation oscillator circuit, the present invention provides a very flexible relaxation oscillator circuit for use in robust designs (e.g., microcontrollers and other digital electronic circuits), and is flexible to adjust for process variations of the semiconductor fabrication process.

In one preferred embodiment, relaxation oscillator circuit 210 comprises four trimmable components 240. It should be appreciated that any number of trimmable components may be used in the present invention. A greater number of trimmable components provides a smaller step size between the trimmable components contributing to a greater accuracy of the current generated. However, a greater number of trimmable components also increase the amount of circuitry and control logic required, increasing the size and the cost of a microcontroller.

Relaxation oscillator 210 produces a clock signal 260 for operating a microcontroller or similar digital electronic circuits. In one preferred embodiment, relaxation oscillator 210 generates a clock signal 260 of substantially 32 KHz.

Figure 3:
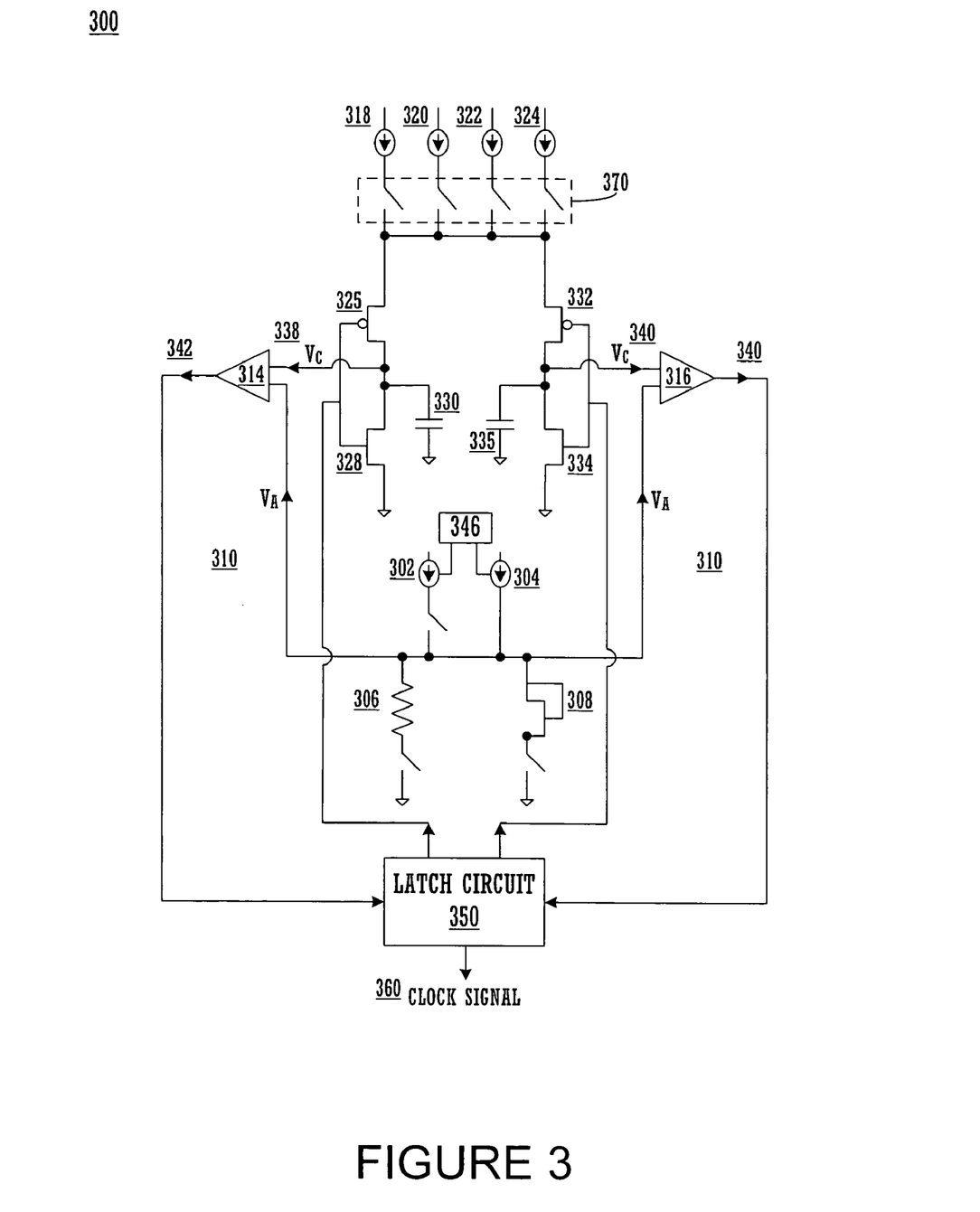
FIG. 3 is a circuit diagram illustrating a dual mode relaxation oscillator circuit with trimmable components in accordance with one embodiment of the present invention.

FIG. 3 is a circuit diagram illustrating a dual mode relaxation oscillator circuit 300 with trimmable components (e.g., trim bits 318, 320, 322 and 324) in accordance with one embodiment of the present invention. Digital control bits 370 control these trimmable components. A relaxation oscillator circuit uses current into a capacitor to create a capacitor voltage $V_C$. A comparator of the relaxation oscillator circuit compares a known reference voltage $V_R$ against the capacitor voltage. When the capacitor voltage reaches the reference voltage, the comparator switches states, creating a clock signal.

In a preferred embodiment of the present invention, the reference voltage $V_R$ is generated by one of two alternatives. The first alternative is a standard low power mode utilizing current source 302 and the second alternative is a very low power mode utilizing a current source 304. Control 346 (e.g. mode selection control 220 of FIG. 2) is coupled to current source 302 and current source 304. Control 346 is used to switch between current source 302 and current source 304. In one embodiment, a very low power mode is used to supply a clock signal during a sleep mode. It should be appreciated that in a preferred embodiment, when current source 304 is used, current source 302 is switched off. In one embodiment, current source 304 is always on, even while current source 302 is switched on. In one implementation of the present embodiment, current source 304 generates substantially less current than current source 302. Thus, current source 304 has a minimal effect on the current generated by current source 302.

In one embodiment, current source 302 supplies a larger current than current source 304. In one preferred embodiment, current source 302 supplies a current of 2 micro amps and current source 304 supplies a current of 100 nano amps.

In the event that current source 302 is switched on (e.g., is the switched current source), reference voltage $V_R$ 310 is generated by transmitting the current through resister 306. Reference voltage $V_R$ 310 is input into comparators 314 and 316. Alternatively, in the event that current source 304 is the switched current source, reference voltage $V_R$ 310 is generated by transmitting the current through diode-connected field effect transistor (FET) 308. Reference voltage $V_R$ 310 is input into comparators 314 and 316.

A microcontroller requires a stable and accurate clock signal to carry out its standard operation. By generating a reference voltage by using a standard current source (e.g., current source 302) transmitting current through a resister, an accurate reference voltage is generated. This reference signal is used by dual mode relaxation oscillator circuit 300 to produce a clock signal. Since the reference voltage is accurate, the clock signal generated is accurate. This clock signal is appropriate for use by a microcontroller in standard operating mode.

Alternatively, by generating a reference voltage by using a very low current source (e.g., current source 304) transmitting current through a diode-connected FET, the reference voltage generated is less accurate. Since the reference voltage is less accurate, the clock signal generated is less accurate. This clock signal is not appropriate for use by a microcontroller in standard operating mode.

However, a less accurate clock signal may be used a microcontroller operating in a sleep mode. When in sleep mode, it is necessary to maintain a clock signal in a microcontroller to time a wake-up event for the microcontroller to exit the sleep mode and resume standard operation. This clock signal need not be as accurate as the clock signal used for standard operation. As such, utilizing a very low current source to generate a reference voltage is useful in operating a microcontroller in a sleep mode by consuming less power.

With reference still to FIG. 3, in one embodiment, at least one current source generates a current used to generate a capacitor voltage 338 and 340. In one embodiment, trimmable components (e.g., trimmable components 318, 320, 322 and 324) operating in conjunction generate a current used to generate a capacitor voltage. The currents generated by the trimmable components are summed, and the summed current is passed through capacitor 330 or capacitor 336. It should be appreciated that the summed current is alternately passed through capacitor 330 or capacitor 336 controlled by latch circuit 350.

In one embodiment, current passed through capacitor 330 also is passed through transistor 326 to generate capacitor voltage 338. Capacitor voltage 338 is a ramp voltage with a relatively slow rise time as compared to a quick fall time (e.g., a sawtooth waveform). Capacitor voltage 338 is input to comparator 314. When capacitor voltage 338 reaches the reference voltage $V_R$ 310, comparator 314 trips generating a signal 342 to feed to latch circuit 350.

In another embodiment, current passed through capacitor 336 also is passed through transistor 332 to generate capacitor voltage 340. Capacitor voltage 340 is also a sawtooth waveform. Capacitor voltage 340 is input to comparator 316. When capacitor voltage 340 reaches the reference voltage $V_R$ 310, comparator 316 trips generating a signal 344 to feed to latch circuit 350.

Latch circuit 350 generates clock signal 360 based on signals 342 and 344. Latch circuit 350 also controls the charging and discharging of capacitors 330 and 336. For example, transistors 326 and 334 are on at the same time so that capacitor 330 charges while capacitor 336 discharges. Alternatively, transistors 328 and 332 are on at the same time so that capacitor 336 charges while capacitor 330 discharges. Thus, latch circuit 350 operates to generate clock signal 360 and to drive the charging and discharging of capacitors 330 and 336.

Figure 4:
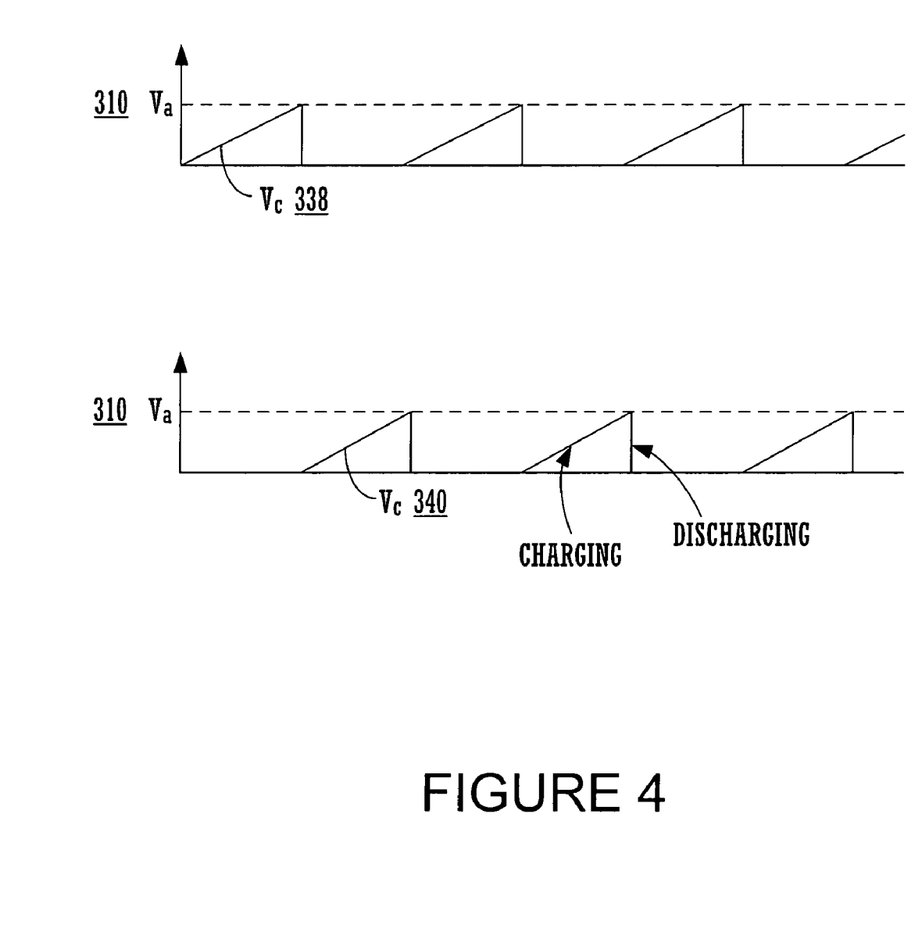
FIG. 4 is a graphical representation of two capacitor voltages operating in the same relaxation oscillator circuit in accordance with one embodiment of the present invention.

FIG. 4 is a graphical representation of two capacitor voltages operating in the same relaxation oscillator circuit as described in the preceding paragraph. Capacitor voltage 338, created by passing current through capacitor 330, charges while capacitor voltage 340 discharges. Likewise, capacitor voltage 340, created by passing current through capacitor 336, charges while capacitor voltage 338 discharges.

Returning to FIG. 3, in one embodiment of the present invention, multiple trimmable components are used to control the capacitor voltage. The trimmable components are operable to account for process variation in capacitor 330 and capacitor 336. The present invention allows for a relaxation oscillator circuit to account for capacitance process variation without requiring external capacitors.

In one preferred embodiment, the relaxation oscillator circuit comprises four trimmable components. It should be appreciated that any number of trimmable components may be used in the present invention. A greater number of trimmable components provide a smaller step size between the trimmable components contributing to a greater accuracy of the current generated. However, a greater number of trimmable components also increase the amount of circuitry and control logic required, increasing the size and the cost of a microcontroller.

Figure 5:
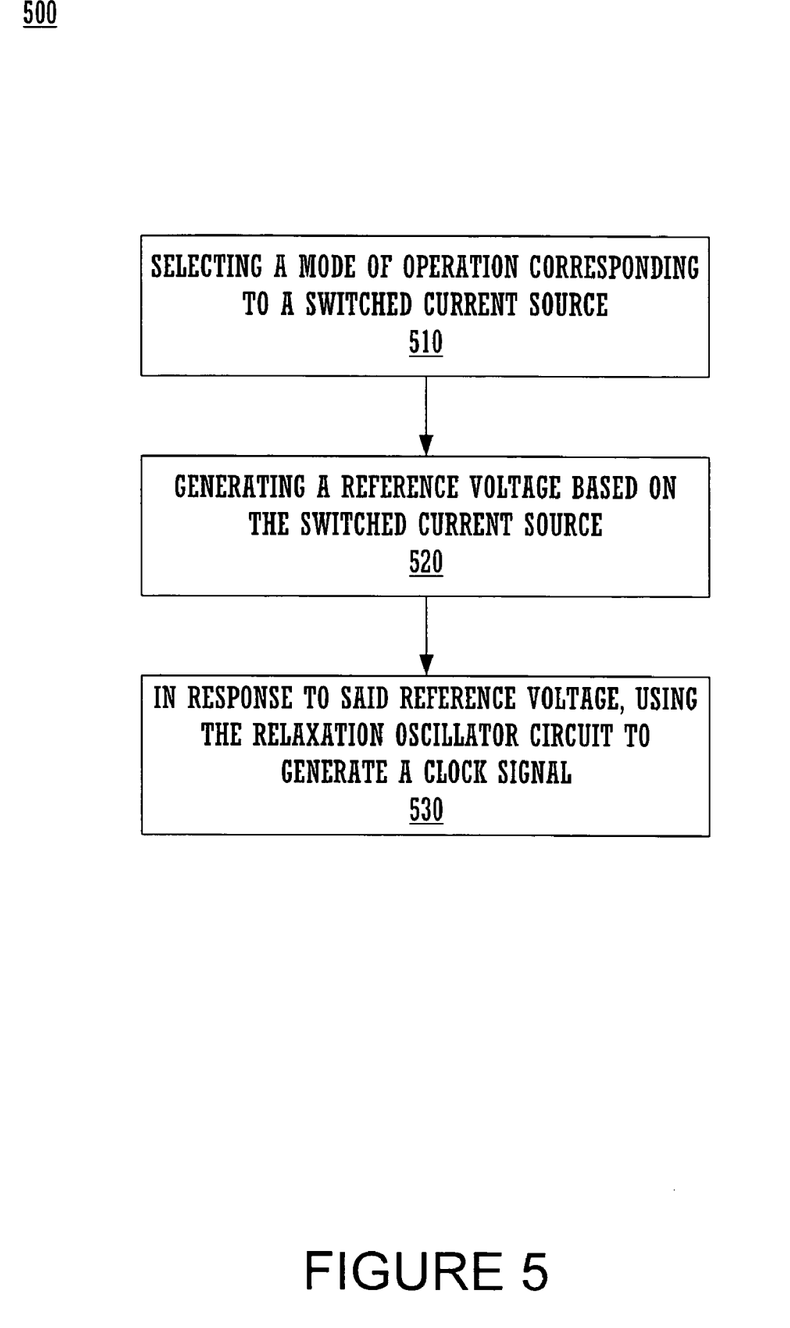
FIG. 5 is a flowchart diagram illustrating the steps of a process of generating a clock signal in a dual mode relaxation oscillator circuit in accordance with one embodiment of the present invention.

FIG. 5 is a flowchart diagram illustrating the steps of a process 500 of generating a clock signal in a dual mode relaxation oscillator circuit (e.g., dual mode relaxation oscillator circuit 300 of FIG. 3) in accordance with one embodiment of the present invention.

In one embodiment, process 500 is implemented in a relaxation oscillator circuit having a first current source for a first power mode and a second current source for a second power mode. In one embodiment, the first power mode is a standard power mode and the second power mode is a very low power mode for providing a clock signal for a microcontroller in a sleep mode.

At step 510, a switched current source corresponding to a present power mode is selected by switching between a first current source for a first power mode and a second current source for a second power mode. In one embodiment, a control (e.g., mode selection control 220 of FIG. 2) is used to select a switched current source.

In one embodiment, the first current source is operable to supply a larger current than the second current source. In the present embodiment, the reference voltage generated from the first current source is more accurate than reference voltage generated from the second current source.

In one embodiment, the first power mode is a low power mode for use in generating a clock signal for the standard operation of a microcontroller. In one embodiment, the second power mode is a very low power mode for use in generating a clock signal for the operation of a microcontroller in a low power mode (e.g., a sleep mode).

At step 520, a reference voltage is generated based on the switched current source. In one embodiment, the first reference voltage is established across a resister. In one embodiment, the second reference voltage is established across a diode-connected (FET).

At step 530, the relaxation oscillator circuit in response to the reference voltage generates a clock signal. In one embodiment, the clock signal is generated by comparing the reference voltage to a ramp voltage in a comparator. When the ramp voltage reaches the reference voltage, the comparator flips, creating a clock signal. In one embodiment, the clock signal generated operates at a frequency of substantially 32 KHz.

The preferred embodiment of the present invention, a microcontroller having a trimmable dual mode relax oscillator, is thus described. While the present invention has been described in particular embodiments, it should be appreciated that the present invention should not be construed as limited by such embodiments, but rather construed according to the below claims.

What is claimed is:

1. An oscillator circuit comprising:
   a relaxation oscillator circuit;
   a first current source for establishing a first reference voltage for use in causing said relaxation oscillator circuit to operate in a first power mode to generate a clock of a first accuracy;
   a second current source for establishing a second reference voltage for use in causing said relaxation oscillator circuit to operate in a second power mode to generate a clock of a second accuracy, wherein said first current source is not operable to establish said second reference voltage; and
   a control coupled to said first current source and said second current source for switching between said first power mode and said second power mode, wherein said relaxation oscillator circuit generates a clock signal operating at a frequency that is substantially the same in both said first power mode and said second power mode.

2. The oscillator circuit as recited in claim 1 wherein said first current source supplies a larger current than said second current source such that said first reference voltage is more accurate than said second reference voltage.

3. The oscillator circuit as recited in claim 1 wherein said first reference voltage is established across a resister.

4. The oscillator circuit as recited in claim 1 wherein said second reference voltage is established across a diode-connected field effect transistor.

5. The oscillator circuit as recited in claim 1 further comprising trimmable current sources operable to control a current charging a capacitor of said relaxation oscillator circuit to account for process variation in said capacitor, said current charging said capacitor for controlling a frequency of said relaxation oscillator.

6. The relaxation oscillator circuit as recited in claim 5 wherein said trimmable current sources are digitally controlled.

7. The relaxation oscillator circuit as recited in claim 1 wherein said first current source generates a current of 2 micro amps.

8. The relaxation oscillator circuit as recited in claim 1 wherein said second current source generates a current of 100 nano amps.

9. A microcontroller comprising:
   a bus;
   a processor coupled to said bus;
   a memory unit coupled to said bus;
   a plurality of input/output pins; and
   a timer circuit coupled to said bus for performing a timing function, said timer circuit comprising a relaxation oscillator circuit having a first power mode associated with a first current source and a second power mode associated with a second current source wherein said relaxation oscillator circuit generates a clock signal operating at a frequency that is substantially the same in both said first power mode and said second power mode, said first power mode and said second power mode being switchable under a control, wherein said relaxation oscillator circuit comprises:
      said first current source coupled to said control for establishing a first reference voltage for use in causing said relaxation oscillator to operate in a first power mode to generate a clock of a first accuracy, wherein said first current source is not used during said second power mode; and
      said second current source coupled to said control for establishing a second reference voltage for use in causing said relaxation oscillator to operate in a second power mode to generate a clock of a second accuracy.

10. The microcontroller as recited in claim 9 wherein said first current source is operable to supply a larger current than said second current source such that said first reference voltage is more accurate than said second reference voltage.

11. The microcontroller as recited in claim 9 wherein said first reference voltage is established across a resister.

12. The microcontroller as recited in claim 9 wherein said second reference voltage is established across a diode-connected field effect transistor (FET).

13. The microcontroller as recited in claim 9 further comprising digitally trimmable current sources coupled to said relaxation oscillator circuit, said digitally trimmable current sources operable to control a current charging a capacitor of said relaxation oscillator circuit to account for process variation in said capacitor, said current charging said capacitor for controlling a frequency of said relaxation oscillator.

14. The microcontroller as recited in claim 13 wherein said digitally trimmable current sources comprise four trimmable current sources.

15. The microcontroller as recited in claim 9 wherein said first current source generates a current of 2 micro amps.

16. The microcontroller as recited in claim 9 wherein said second current source generates a current of 100 nano amps.

17. The microcontroller as recited in claim 9 wherein said relaxation oscillator circuit generates a clock signal operating at a frequency of substantially 32 KHz.

18. In a relaxation oscillator circuit having a first current source for a first power mode and a second current source for a second power mode, a method for generating clock signals comprising:

selecting a switched current source corresponding to a present power mode by switching between said first current source for said first power mode and said second current source for said second power mode, wherein said first current source is not used during said second power mode;

generating a reference voltage based on said switched current source; and in response to said reference voltage, using said relaxation oscillator circuit to generate a clock signal having an accuracy that depends on said present power mode, wherein said clock signal operates at a frequency that is substantially the same in both said first power mode and said second power mode.

19. The method as recited in claim 18 wherein said first current source is operable to supply a larger current than said second current source.

20. The method as recited in claim 18 wherein said first power mode is a low power mode.

21. The method as recited in claim 18 wherein said second power mode is a very low power mode.

22. The method as recited in claim 18 wherein said relaxation oscillator circuit further comprises digitally trimmable current sources, said digitally trimmable current sources operable to control a current charging a capacitor of said relaxation oscillator circuit to account for process variation in said capacitor, said current charging said capacitor for generating said clock signal.

23. The method as recited in claim 22 wherein said relaxation oscillator circuit comprises four trimmable current sources.

24. The method as recited in claim 18 wherein said first current source generates a current of 2 micro amps.

25. The method as recited in claim 18 wherein said second current source generates a current of 100 nano amps.

26. The method as recited in claim 18 wherein said clock signal operates at a frequency of substantially 32 KHz.

* * * * *